United States Patent
Takazane (10) Patent No.: US 10,714,899 B2
(45) Date of Patent: Jul. 14, 2020

(54) SEMICONDUCTOR LASER MODULE AND LASER OSCILLATOR

(71) Applicant: FANUC CORPORATION, Yamanashi (JP)

(72) Inventor: Tetsuhisa Takazane, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/240,600

(22) Filed: Jan. 4, 2019

(65) Prior Publication Data

US 2019/0245325 A1 Aug. 8, 2019

(30) Foreign Application Priority Data

Feb. 2, 2018 (JP) .................................. 2018-017140

(51) Int. Cl.
| | |
|---|---|
| *H01S 5/183* | (2006.01) |
| *H01S 5/022* | (2006.01) |
| *H01S 5/00* | (2006.01) |
| *H01S 5/40* | (2006.01) |

(52) U.S. Cl.
CPC ........ *H01S 5/18361* (2013.01); *H01S 5/0064* (2013.01); *H01S 5/0071* (2013.01); *H01S 5/02284* (2013.01); *H01S 5/4012* (2013.01); *H01S 5/02208* (2013.01); *H01S 5/4087* (2013.01)

(58) Field of Classification Search
CPC .. H01S 5/18361; H01S 5/4012; H01S 5/0071; H01S 5/0064; H01S 5/02284; H01S 5/02208; H01S 5/4087; H01S 5/02292; G02B 5/26; G02B 6/4214; G02B 27/14
See application file for complete search history.

(56) References Cited

U.S. PATENT DOCUMENTS

| | | | | |
|---|---|---|---|---|
| 4,850,661 | A * | 7/1989 | Kawakatsu | ............... G02B 5/10 359/359 |
| 6,219,119 | B1 * | 4/2001 | Nakai | ............... G02F 1/133526 349/113 |
| 6,603,789 | B1 * | 8/2003 | Kleinschmidt | ......... H01S 3/106 372/102 |

(Continued)

FOREIGN PATENT DOCUMENTS

| | | |
|---|---|---|
| JP | S62-260106 A | 11/1987 |
| JP | H01-250904 A | 10/1989 |

(Continued)

OTHER PUBLICATIONS

An Office Action; "Notification of Reasons for Refusal," mailed by the Japanese Patent Office dated Dec. 17, 2019, which corresponds to Japanese Patent Application No. 2018-017140 and is related to U.S. Appl. No. 16/240,600; with English language translation.

*Primary Examiner* — Xinning (Tom) Niu (74) *Attorney, Agent, or Firm* — Studebaker & Brackett PC (57) ABSTRACT

The present invention provides a semiconductor laser module including: a mirror that comprises a first surface which reflects laser light and which transmits visible light and a second surface which transmits the laser light and which reflects the visible light; and a semiconductor laser element that emits the laser light which is applied to the first surface of the mirror.

6 Claims, 8 Drawing Sheets

(56) References Cited

U.S. PATENT DOCUMENTS

| | | | | |
|---|---|---|---|---|
| 8,440,953 B2* | 5/2013 | Kamijima | ............... | G02B 5/32 |
| | | | | 250/208.1 |
| 2004/0057477 A1* | 3/2004 | Barron | ............... | H01S 5/0687 |
| | | | | 372/32 |
| 2007/0230532 A1* | 10/2007 | Copner | ............... | H01S 3/109 |
| | | | | 372/92 |
| 2008/0226221 A1* | 9/2008 | Bidnyk | ............... | G02B 6/42 |
| | | | | 385/14 |
| 2010/0277804 A1 | 11/2010 | Galvanauskas et al. | | |
| 2012/0027043 A1 | 2/2012 | Valk | | |
| 2017/0271837 A1 | 9/2017 | Hemenway et al. | | |

FOREIGN PATENT DOCUMENTS

| | | |
|---|---|---|
| JP | H02-081002 A | 3/1990 |
| JP | H02-122581 A | 5/1990 |
| JP | H07-154011 A | 6/1995 |
| JP | H09-096720 A | 4/1997 |
| JP | 2009-122203 A | 6/2009 |
| WO | 2014/013912 A1 | 1/2014 |

\* cited by examiner

SEMICONDUCTOR LASER MODULE AND LASER OSCILLATOR

This application is based on and claims the benefit of priority from Japanese Patent Application No. 2018-017140, filed on 2 Feb. 2018, the content of which is incorporated herein by reference.

BACKGROUND OF THE INVENTION

Field of the Invention

The present invention relates to a semiconductor laser module and a laser oscillator comprising such a semiconductor laser module.

Related Art

A laser oscillator which is used in the cutting, the welding or the like of, for example, a metal or a plastic material incorporates a semiconductor laser module as a light source or a light source for excitation. The semiconductor laser module couples (optically couples) laser light emitted by a semiconductor laser element to an optical fiber or propagates the laser light through space so as to supply the laser to a resonator or the like.

In an optical system which couples the semiconductor laser element with the optical fiber, a lens and a mirror are used. Among them, the front surface of the mirror is processed so as to reflect the laser light, and the back surface of the mirror is processed so as not to reflect the laser light. Specifically, the front surface of the mirror is processed into a transparent surface by reflection coating in order to reflect the laser light. The back surface of the mirror is processed into an opaque surface by sand blast or the like in order to scatter the laser light and thereby prevent the laser light from being reflected. By the difference in the processing between the front surface and the back surface of the mirror, the manufacturer of the semiconductor laser module has been allowed to distinguish between the front surface and the back surface of the mirror.

Further, a configuration for distinguishing between the front surface and the back surface of a mirror is conventionally proposed (see, for example, patent document 1). Patent document 1 proposes a technology wherein in the front surface of a mirror, part of a portion that does not affect reflection performance is formed into a nonreflective surface, and wherein thus the front surface of the mirror is distinguished from the back surface.

Patent Document 1: Japanese Unexamined Patent Application, Publication No. H02-81002

SUMMARY OF THE INVENTION

However, the sand blast is performed on the back surface of the mirror, and thus the mirror is scratched, with the result that the strength and durability of the mirror are lowered. The laser light is repeatedly applied to the front surface of the mirror, and thus the temperature of the mirror is frequently changed, with the result that the mirror may be broken in heat cycles. Furthermore, the sand blast is performed on the back surface of the mirror, and thus the number of steps is increased.

In the technology disclosed in patent document 1, in the front surface of the mirror, not only the effective range of the reflection performance but also the portion which does not affect the reflection performance is needed. Hence, a step of forming the portion which does not affect the reflection performance is separately needed, and thus the number of steps is increased.

The present invention is made in view of the foregoing conditions, and an object thereof is to provide a semiconductor laser module which can reduce the scratches of a mirror and the number of steps and a laser oscillator which comprises such a semiconductor laser module.

(1) The present invention relates to a semiconductor laser module (for example, a semiconductor laser module 10 which will be described later) which includes: a mirror (for example, a mirror 5, 5a, 5b, 5c which will be described later) that comprises: a first surface (for example, a first surface 51 which will be described later) which reflects laser light (for example, laser light R1 which will be described later) and which transmits visible light and a second surface (for example, a second surface 52 which will be described later) which transmits the laser light and which reflects the visible light; and a semiconductor laser element (for example, a semiconductor laser element 3, 31, 32, 33 which will be described later) that emits the laser light which is applied to the first surface of the mirror.

(2) In the semiconductor laser module of (1), the first surface and the second surface may transmit light whose wavelength is longer than the wavelength of the laser light applied by the semiconductor laser element.

(3) In the semiconductor laser module of (1) or (2), the surface roughness of the second surface may be higher than the surface roughness of the first surface.

(4) In the semiconductor laser module of any one of (1) to (3), the second surface may be a spherical surface or a cylindrical surface.

(5) In the semiconductor laser module of any one of (1) to (4), a distance (for example, a distance t which will be described later) between the first surface and the second surface may be longer than a half of a width (for example, a width L which will be described later) of the first surface.

(6) In the semiconductor laser module of any one of (1) to (5), the second surface may include a notch portion (for example, a notch portion 52x which will be described later).

(7) The present invention relates to a laser oscillator (for example, a laser oscillator 1 which will be described later) which comprises the semiconductor laser module of any one of (1) to (6).

According to the present invention, it is possible to provide a semiconductor laser module and a laser oscillator which can reduce the scratches of a mirror and the number of steps.

BRIEF DESCRIPTION OF THE DRAWINGS

FIG. 1 is a schematic configuration diagram showing a laser oscillator according to an embodiment of the present invention;

FIG. 5A is an enlarged cross-sectional view of a mirror 5;

FIG. 5B is a schematic cross-sectional view of a mirror included in the semiconductor laser module of the laser oscillator according to the embodiment of the present invention;

FIG. 8 is a schematic cross-sectional view of a mirror included in the semiconductor laser module of a laser oscillator according to variation 4 of the present invention.

DETAILED DESCRIPTION OF THE INVENTION

Overall Configuration of Laser Oscillator

A laser oscillator according to an embodiment of the present invention will be described with reference to drawings. FIG. 1 is a schematic configuration diagram showing the laser oscillator according to the embodiment of the present invention. The laser oscillator 1 of the present embodiment includes a plurality of (in the example of the figure, three) semiconductor laser modules 10 (11, 12, 13). Laser light is supplied from the semiconductor laser modules 10 (11, 12, 13) through optical fibers 20 (21, 22, 23) to a resonator or a combiner 30 (resonator, combiner).

When the resonator is comprised, the laser light from the semiconductor laser modules 10 (11, 12, 13) is used as excitation light for the resonator. When only the combiner is comprised, the laser light from a plurality of the semiconductor laser modules 10 (11, 12, 13) is combined by the combiner into one so as to be used. Both the resonator and the combiner may be comprised. In any one of the methods, the laser oscillator 1 emits the laser light through an output optical fiber 40.

Overall Configuration of Semiconductor Laser Module

Figure 2:
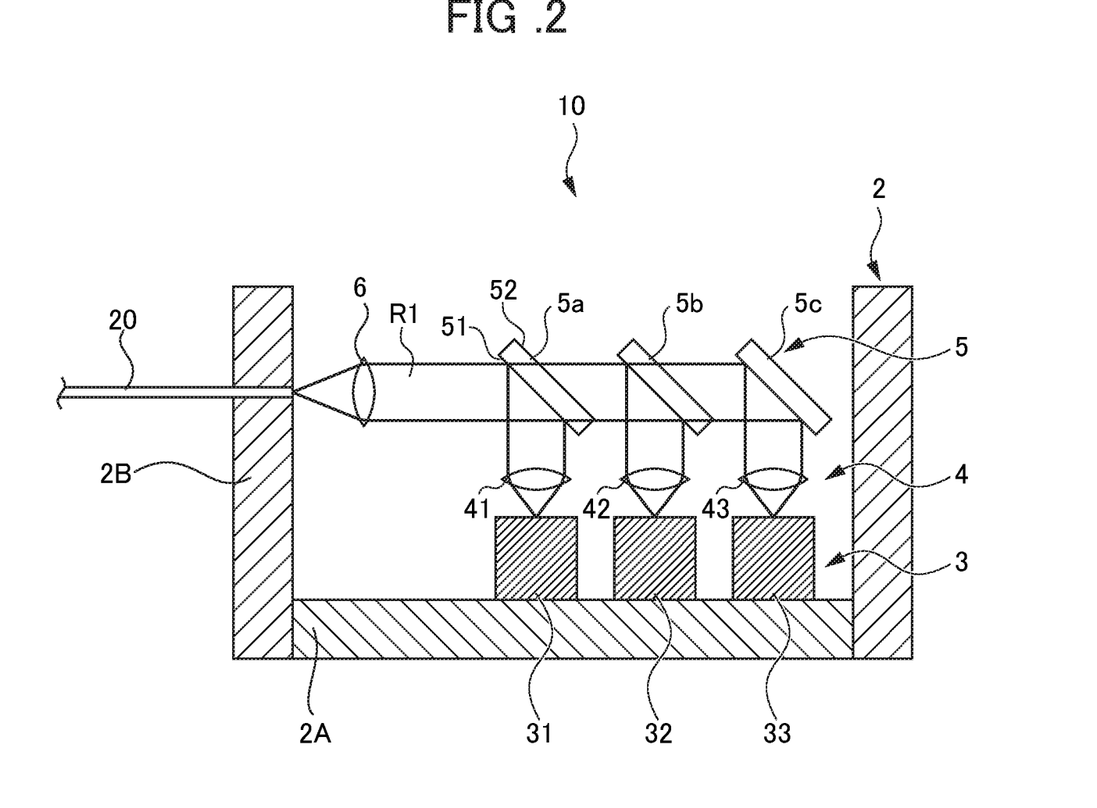
FIG. 2 is a schematic plan view showing the semiconductor laser module of the laser oscillator of FIG. 1.

FIG. 2 is a schematic plan view showing the semiconductor laser module of the laser oscillator of FIG. 1. The semiconductor laser module 10 comprises, in the housing 2 thereof, semiconductor laser elements 3 (31, 32, 33), lenses 4 (41, 42, 43), mirrors 5 (5a, 5b, 5c) and a lens 6.

A plurality of (in the example of the figure, three) semiconductor laser elements 3 (31, 32, 33) are arranged on a side wall 2A of the housing 2. The semiconductor laser elements 3 (31, 32, 33) emit laser light R1 toward the lenses 4 (41, 42, 43).

The surfaces (the lower surfaces in FIG. 2) on one side of a plurality of (in the example of the figure, three) lenses 4 (41, 42, 43) are separately oppose the emission ports of each the semiconductor laser elements 3 (31, 32, 33). Each of the lenses 4 (41, 42, 43) respectively transmit the laser light R1 emitted by the semiconductor laser elements 3 (31, 32, 33).

The mirrors 5 (5a, 5b, 5c) are inclined so as to oppose the surfaces (the upper surfaces in FIG. 2) on the other side of the plurality of lenses 4 (41, 42, 43). The mirrors 5 (5a, 5b, 5c) have the function of changing the directions of travel of the laser light R1. The mirrors 5 (5a, 5b, 5c) respectively bend the directions of travel (optical axes) of the transmission light of the lenses 4 (41, 42, 43) at right angles.

The three mirrors 5 (5a, 5b, 5c) are arranged so as to be parallel to each other, and are inclined at the same angle with respect to the optical axes of the lenses 4 (41, 42, 43). The mirrors 5 (5a, 5b, 5c) are inclined at 45° with respect to the optical axes of the lenses 4 (41, 42, 43). The directions in which the laser light R1 emitted from the semiconductor laser elements 3 (31, 32, 33) is reflected by the three mirrors (5a, 5b, 5c) are the same. The directions in which the mirrors 5 (5a, 5b, 5c) reflect the laser light R1 are toward the lens 6.

The lens 6 is arranged between the leftmost mirror 5a of the three mirrors 5 (5a, 5b, 5c) and a side wall 2B of the housing 2. The lens 6 is arranged such that the optical axis of the lens 6 intersects the optical axes of the lenses 4 at 90°. Through the lens 6, the laser light R1 from all the semiconductor laser elements 3 (31, 32, 33) which is reflected by the mirrors 5 (5a, 5b, 5c) and is transmitted (collected). Hence, the lenses 4 (41, 42, 43) are exposed to relatively low energy whereas the lens 6 and the optical fiber 20 are exposed to relatively high energy.

The optical fiber 20 is extended from the housing 2. The laser light R1 emitted from the semiconductor laser elements 3 is combined by the three lenses 4 (41, 42, 43), the three mirrors 5 (5a, 5b, 5c) and the lens 6 with the optical fiber 20.

Figure 3:
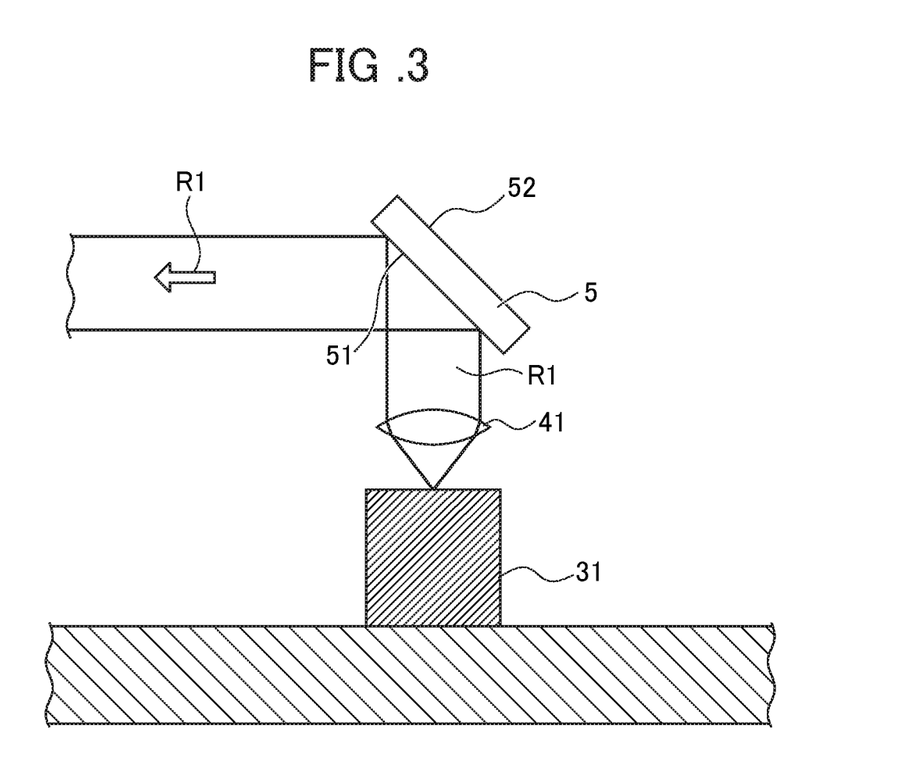
FIG. 3 is a partial enlarged plan view of the semiconductor laser module of FIG. 2.

FIG. 3 is an enlarged view of the semiconductor laser element 3, the lens 4 and the mirror 5 in FIG. 2. The mirror 5 includes a first surface 51 and a second surface 52 which is a surface opposite to the first surface 51. The laser light R1 which is light-emitted (emitted) by the semiconductor laser element 3 is reflected by the first surface 51 of the mirror 5 and is guided to the lens 6 and the optical fiber 20. However, part of the laser light R1 is transmitted through the first surface 51 of the mirror 5 and is transmitted through the second surface 52 so as not to be guided to the lens 6 and the optical fiber 20. A small amount of laser light is transmitted through the mirror 5 (in FIG. 3, the laser light which is transmitted through the second surface 52 is not shown). The first surface 51 and the second surface 52 of the mirror 5 will be described in detail below.

First Surface

The first surface 51 is a surface which reflects the laser light R1 and transmits visible light. Since the reflectance of the laser light R1 in the first surface 51 significantly affects a laser output amount, the reflectance is preferably high, and is, for example, 99.5% or more and is preferably 99.8% or more.

The transmittance of the visible light in the first surface 51 is, for example, 80% or more, and is preferably 90% or more. Since the first surface 51 transmits the visible light, the first surface 51 appears transparent. The reflectance of the visible light in the first surface 51 is, for example, 20% or less, and is preferably 10% or less.

Figure 4:
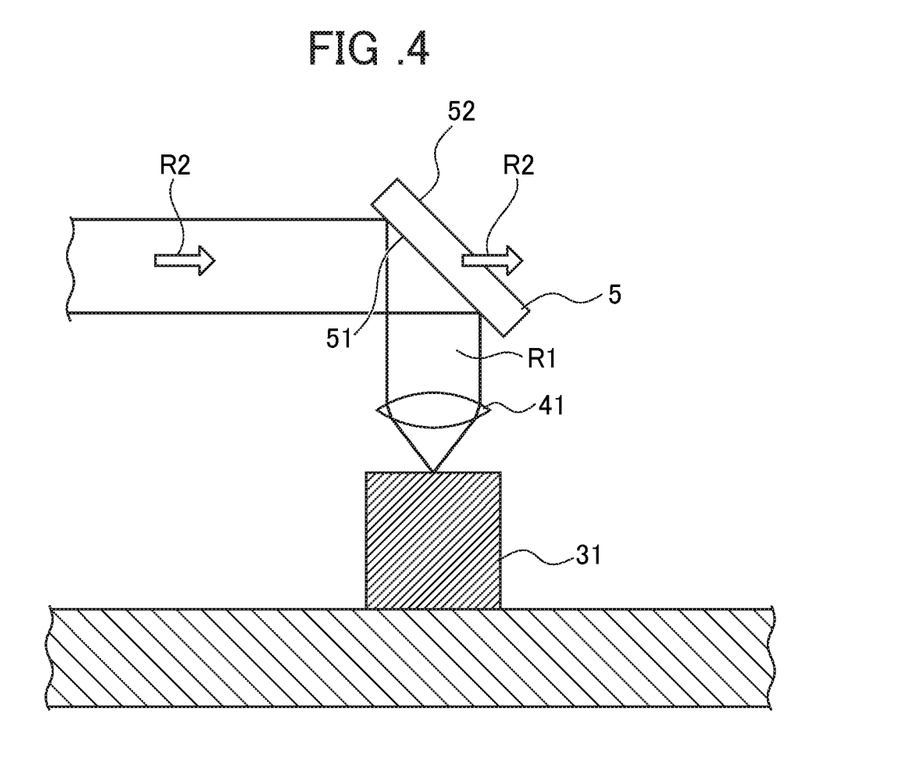
FIG. 4 is a partial enlarged plan view of the semiconductor laser module of the laser oscillator according to the embodiment of the present invention.

The transmittance of return light which is returned from the outside of the semiconductor laser module 10 to the first surface 51 of the mirror 5 will be described with reference to FIG. 4. FIG. 4 is a partial enlarged plan view of the semiconductor laser module 10 and shows how the return light R2 is returned from the outside of the semiconductor laser module 10 to the mirror 5. The wavelength of the laser light R1 of the semiconductor laser element 3 is on the order of 900 nm, and the wavelength of the laser light of the fiber laser is on the order of 1000 nm. The return light R2 which is returned from the resonator or the combiner of the fiber laser includes not only the laser light of the fiber laser but also a component of a longer wavelength such as SRS.

The SRS is a phenomenon in which laser light interacts with the lattice vibration (optical phonon) of molecules (SiO2) of the fiber, with the result that the laser light is scattered as light (stokes light) whose wavelength is shifted to a long wavelength by energy of the lattice vibration.

When the return light R2 directly reaches the semiconductor laser element 3, the semiconductor laser element 3 is damaged. In order to protect the semiconductor laser element 3 from the return light R2, it is necessary to prevent the component of the return light R2 whose wavelength is longer than the wavelength of the laser light R1 from the semiconductor laser module 10 from being returned to the semiconductor laser element 3. Hence, a coating which transmits the component whose wavelength is longer than the wavelength of the laser light R1 is applied to the first surface 51 and the second surface 52 of the mirror 5.

The transmittance of the return light R2 (laser whose wavelength is long) in the first surface 51 is preferably high, and is, for example, 99.0% or more and is preferably 99.7% or more.

A first coating layer 54 on the side of the first surface 51 of the mirror 5 will be described with reference to FIG. 5A. FIG. 5A is an enlarged cross-sectional view of the mirror 5. One surface (surface on the left side of FIG. 5A) of a glass base material 53 is coated with the first coating layer 54 of the first surface 51. In order for the first surface 51 to have a high reflectance, the first coating layer 54 is formed by applying about 30 layers of high refractive index layers and low refractive index layers. For example, the thickness of the first coating layer 54 is about 3 μm.

Second Surface

With reference back to FIG. 3, the second surface 52 will be described. The second surface 52 is a surface which transmits the laser light R1 and reflects the visible light. The transmittance of the laser light R1 in the second surface 52 is, for example, 95% or more, and is preferably 98% or more. The transmittance of the laser light R1 in the second surface 52 does not need to be excessively high because the reflection components of the laser light R1 by the second surface 52 are attenuated.

Since the second surface 52 reflects the visible light, the second surface 52 appears opaque. The reflectance of the visible light in the second surface 52 is, for example, 70% or more, and is preferably 90% or more. The reflectance of the visible light in the second surface 52 does not need to be excessively high because the second surface 52 is preferably visually recognized. The reflectance of the visible light in the second surface 52 is, for example, 30% or less, and is preferably 10% or less.

With reference back to FIG. 4, a description will be given. The transmittance of the return light R2 (laser whose wavelength is long) in the second surface 52 is preferably high as in the first surface 51, and is, for example, 99.0% or more and is preferably 99.7% or more.

With reference back to FIG. 5A, a description will be given. A second coating layer 55 of the second surface 52 of the mirror 5 will be described. The other surface (surface on the right side of FIG. 5A) of the glass base material 53 is coated with the second coating layer 55. Since the reflectance of the second surface 52 is that of about 70 to 90% of the transmission of the laser light R1 and the visible light, the second coating layer 55 is formed by applying 10 or less layers. For example, the thickness of the second coating layer 55 is equal to or less than 1 μm. Since the second coating layer 55 is not required to have performance of reflecting the laser light R1, the second coating layer 55 may be thinner than the first coating layer 54.

However, in the first coating layer 54 and the second coating layer 55 described above, stress occurs in a direction in which the glass base material 53 is stretched. In order for the stress to be balanced, the thickness of the first coating layer 54 and the thickness of the second coating layer 55 need to be equal to each other, and for example, the second coating layer 55 is further coated with a third coating layer 56 of low refractive index layers with a thickness of about 2 μm. Hence, the thickness of the first coating layer 54 is set substantially equal to a thickness of the second coating layer 55 and the third coating layer 56 combined. The third coating layer 56 is a dummy-like layer which is not required to have the reflection performance of the laser light, and is provided in order to reduce the warpage of the mirror 5.

FIG. 5B is a cross-sectional view of the mirror 5 included in the semiconductor laser module 10. The coating whose surface roughness is higher than the surface roughness of the first surface 51 is applied to the second surface 52. The surface roughness of the second surface 52 is, for example, Ra1 [μm], and is preferably Ra3 [μm]. The surface roughness of the first surface 51 is, for example, Ra0.3 [μm], and is preferably Ra0.1 [μm]. The second surface 52 is formed such that the surface roughness thereof is increased, and thus the laser light R1 is scattered, with the result that the reflectance of the laser light R1 is lowered. Specifically, on the second surface 52, for example, a method of increasing the surface roughness by lowering the intensity of ion assistance in a vapor deposition device which incorporates ion assistance is performed.

A process of travel of the laser light R1 emitted from the semiconductor laser elements 3 (31, 32, 33) will then be described. As shown in FIG. 2, the laser light R1 which is light-emitted (emitted) from the semiconductor laser elements 3 (31, 32, 33) is transmitted through the lenses 4 (41, 42, 43) so as to travel as parallel light, is reflected by the mirrors 5 (5a, 5b, 5c) and is guided to the lens 6. Here, the laser light R1 reflected by the mirror 5c is transmitted through the mirror 5b and the mirror 5a and is guided to the lens 6. The laser light R1 reflected by the mirror 5b is transmitted through the mirror 5a and is guided to the lens 6. The laser light R1 reflected by the mirror 5a is directly guided to the lens 6.

The laser light R1 focused by the lens 6 is combined to the optical fiber 20. Then, as shown in FIG. 1, the laser light R1 is amplified by the resonator or the combiner and is guided to the output optical fiber 40.

Effects of Embodiment

According to the present embodiment, for example, the following effects are achieved. The semiconductor laser module 10 of the embodiment comprises: the mirror 5 that includes the first surface 51 which reflects the laser light R1 and transmits the visible light, and the second surface 52 which transmits the laser light R1 and reflects the visible light; and the semiconductor laser element 3 that emits the laser light R1 which is applied to the first surface 51 of the mirror 5. Hence, it is possible to provide the semiconductor laser module 10 and the laser oscillator 1 which can reduce the scratches of the mirror 5 and the number of steps. A detailed description will be given below.

The second surface 52 of the mirror 5 reflects the visible light whereas the first surface 51 transmits the visible light. In this way, the second surface 52 appears opaque, and the first surface 51 appears transparent. Hence, a manufacturer recognizes different transparencies (colors) of the second surface 52 and the first surface 51 in the mirror 5 so as to be able to easily distinguish between the second surface 52 and the first surface 51. It is not necessary to perform sand blast on the second surface 52 of the mirror 5, and thus the manufacturer of the semiconductor laser module 10 can perform polishing processing not only on the first surface 51 of the mirror 5 but also on the second surface 52. Consequently, it is possible to reduce the scratches of the second surface 52 of the mirror 5. Hence, the durability of the mirror 5 in heat cycles is enhanced, and the durability of the semiconductor laser module 10 in heat cycles is enhanced. At the same time, the number of steps in the manufacturing of the mirror 5 is reduced. Hence, the manufacturing efficiency of the semiconductor laser module 10 is enhanced.

In the semiconductor laser module 10 of the embodiment, the first surface 51 and the second surface 52 transmit light whose wavelength is longer than the wavelength of the laser light R1 applied by the semiconductor laser element 3. Hence, a phenomenon is reduced in which the light of the return light R2 whose wavelength is longer than the wavelength of the laser light R1 is transmitted through the mirror 5 so as to be removed and in which the light of the return light R2 whose wavelength is long is reflected by the mirror 5 so as to be returned to the semiconductor laser element 3. Hence, the damage of the semiconductor laser element 3 caused by the light of the return light R2 whose wavelength is long is reduced, and thus the semiconductor laser element 3 is protected.

In the semiconductor laser module 10 of the embodiment, the surface roughness of the second surface 52 is higher than the surface roughness of the first surface 51. Hence, the reflectance of the laser light R1 in the second surface 52 is reduced.

Variation 1

Figure 6A:
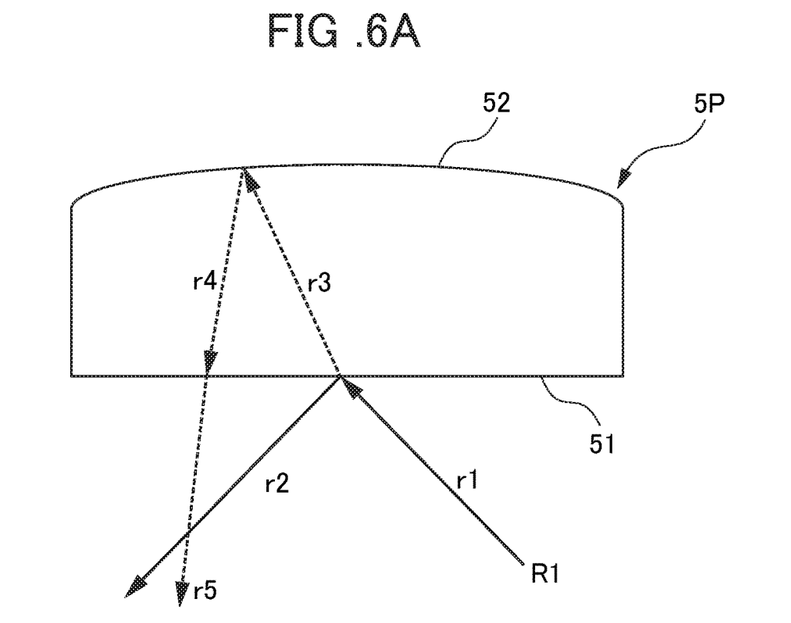
FIG. 6A is a schematic cross-sectional view of a mirror included in the semiconductor laser module of a laser oscillator according to variation 1 of the present invention.

FIG. 6A is a schematic cross-sectional view of a mirror 5P included in the semiconductor laser module 10 of a laser oscillator according to variation 1. In the semiconductor laser module 10, instead of the mirror 5, the mirror 50 is used. The second surface 52 of the mirror 5P is a spherical surface or a cylindrical surface (in FIG. 6P, the second surface 52 is shown as a curved surface).

In the semiconductor laser module 10 comprising the mirror 5P of variation 1, the second surface 52 is a spherical surface or a cylindrical surface. Hence, when the manufacturer of the semiconductor laser module 10 erroneously recognizes the first surface 51 and the second surface 52 of the mirror 5 so as to mount the mirror 50 in the housing 2, the laser light R1 is not combined to the output optical fiber 40. In this way, the laser output combined to the output optical fiber 40 is significantly lowered. Consequently, the manufacturer can easily notice that after the mounting of the mirror 5P, the front and back of the mirror 5P were erroneously recognized such that the semiconductor laser module 10 became defective.

Even when the manufacturer correctly mounts the mirror 5P, an angle at which the component of a small amount of laser light R1 reflected by the second surface 52 is emitted from the mirror 5P is changed. This state will be described below. The laser light R1 emitted from the semiconductor laser element 3 travels toward the first surface 51 in the direction of an arrow r1, and is reflected by the first surface 51 so as to travel in the direction of an arrow r2. The laser light R1 travelling in the direction of the arrow r2 travels toward the lens 6 and the optical fiber 20. Whereas, the laser light R1 of the laser light R1 travelling in the direction of the arrow r1 which travels in the direction of an arrow r3 is reflected by the second surface 52 that is the curved surface so as to travel in the direction of an arrow r4, and is transmitted through the first surface 51 so as to travel the direction of an arrow r5.

The laser light R1 which is reflected by the second surface 52 so as to travel in the direction of the arrow r5 differs in emission angle from the laser light R1 which is reflected by the first surface 51 so as to travel in the direction of the arrow r2. Consequently, the guiding of the unnecessary reflection component of the laser light R1 by the second surface 52 to the lens 6 and the optical fiber 20 is reduced, and thus increases in the temperatures of the lens 6 and the optical fiber 20 are reduced.

Variation 2

Figure 6B:
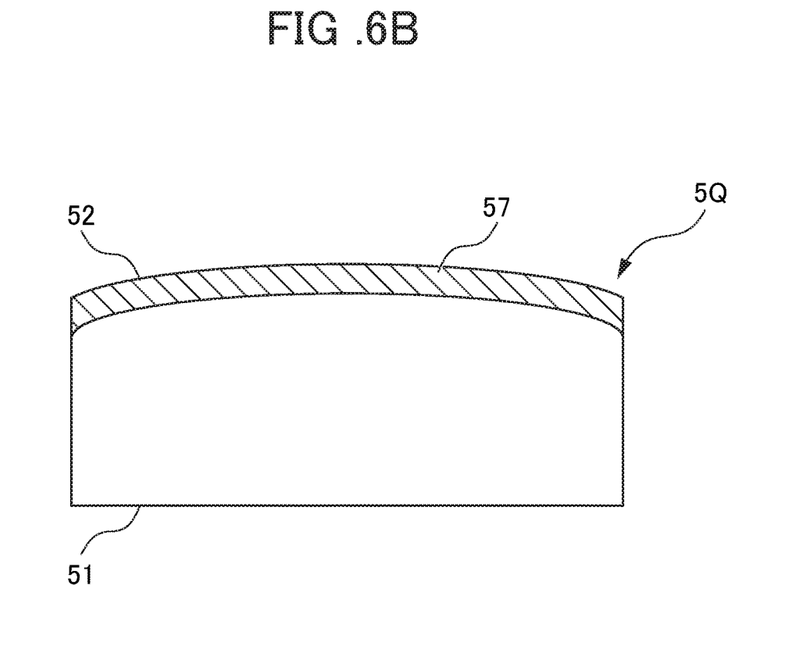
FIG. 6B is a schematic cross-sectional view of a mirror included in the semiconductor laser module of a laser oscillator according to variation 2 of the present invention.

FIG. 6B is a schematic cross-sectional view of a mirror 5Q included in the semiconductor laser module 10 of a laser oscillator according to variation 2. In the semiconductor laser module 10, instead of the mirror 5, the mirror 5Q is used. In the mirror 5Q, a portion which corresponds to the second surface 52 of the mirror 5P in variation 1 is coated, and thus a coating layer 57 whose surface roughness is high is formed, with the result that the surface of the coating layer 57 is the second surface 52.

Variation 3

Figure 7:
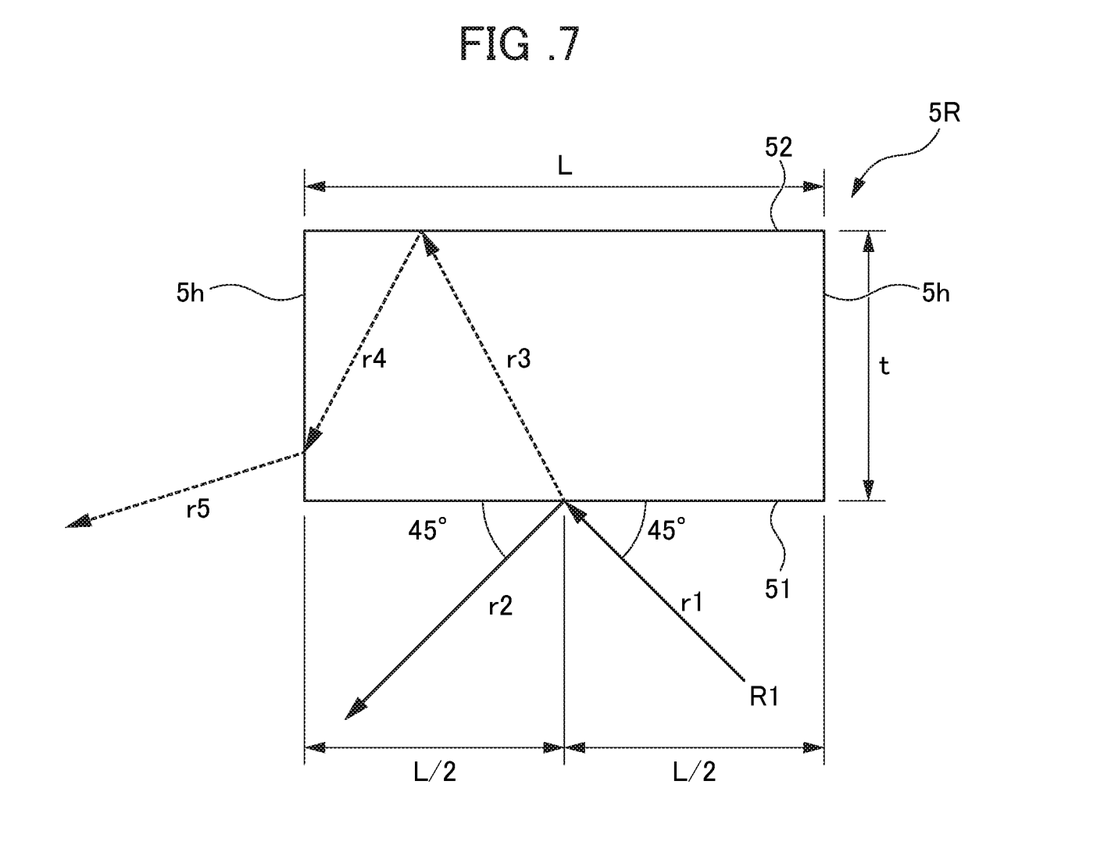
FIG. 7 is a schematic cross-sectional view of a mirror included in the semiconductor laser module of a laser oscillator according to variation 3 of the present invention.

FIG. 7 is a schematic cross-sectional view of a mirror 5R included in the semiconductor laser module 10 of a laser oscillator according to variation 3. In the semiconductor laser module 10, instead of the mirror 5, the mirror 5R is used. A distance t (thickness of the mirror 5R) between the first surface 51 and the second surface 52 is longer than a half of the width L of the first surface 51.

It is assumed that as shown in FIG. 7, the thickness of the mirror 5R is t and that the width of the mirror 5R is L. In this case, the laser light R1 emitted from the semiconductor laser element 3 travels in the direction of an arrow r1, and is reflected by the first surface 51 so as to travel in the direction of an arrow r2.

On the other hand, part of the laser light R1 travelling in the direction of the arrow r1 travels in the direction of an arrow r3, is reflected by the second surface 52 so as to travel in the direction of an arrow r4 and is refracted by a side surface 5h of the mirror 5R so as to travel in the direction of an arrow r5. Here, the reflection optical path of the arrow r4 of the laser light R1 reflected by the second surface 52 is shorter than the incident optical path of the arrow r3 of the laser light R1 incident on the second surface 52, and thus the reflection optical path does not reach the first surface 51.

For example, in a case where the laser light R1 travelling in the direction of the arrow r1 is incident on the center of the first surface 51 at an incident angle of 45°, when t=L/2 or more (the thickness of the mirror 5R is equal to or more than about a half of the width of the mirror 5R) substantially holds true, the laser light R1 is reflected by the second surface 52 and is thereafter emitted from the side surface 5h.

In the semiconductor laser module 10 comprising the mirror 5Q of variation 3, the distance t between the first surface 51 and the second surface 52 is longer than the half of the width L of the first surface 51. Simply stated, the thickness of the mirror 5R is thicker than the half of the width L of the first surface 51.

Hence, when the laser light R1 enters the first surface 51 and is reflected by the second surface 52, from among the component of a small amount of laser light R1 reflected by the second surface 52, a component which is emitted from the side surface 5h adjacent to the first surface 51 of the mirror 5R is increased. The laser light R1 which is emitted from the side surface 5h of the mirror 5R so as to travel the direction of the arrow r5 differs in emission angle from the laser light R1 travelling in the direction of the arrow r2. Consequently, the guiding of the unnecessary reflection component of the laser light R1 by the second surface 52 to the lens 6 and the optical fiber 20 is reduced, and thus increases in the temperatures of the lens 6 and the optical fiber 20 are reduced.

Variation 4

FIG. 8 is a schematic cross-sectional view of a mirror 5S included in the semiconductor laser module 10 of a laser oscillator according to variation 4. In the semiconductor laser module 10, instead of the mirror 5, the mirror 5S may be used. The second surface 52 of the mirror 5S includes a notch portion 52x. The notch portion 52x is also a concave portion. The concave portion is not limited to an inverse triangle in cross section, and may be a quadrangle or a semicircle in cross section.

In the semiconductor laser module 10 comprising the mirror 5S of variation 4, the second surface 52 includes the notch portion 52x. When a method of manufacturing the mirror 5 is a method of performing coating and then performing cutting by dicing, the notch portion 52x is easily formed in the second surface 52 with a dicing saw in a step of dicing. A step of forming the notch portion 52x is substantially included in the step of dicing, and thus it may be said that the number of steps is reduced.

Moreover, since the second surface 52 includes the notch portion 52x, the visible light is diffusely reflected by the notch portion 52x. The manufacturer can easily distinguish between the first surface 51 and the second surface 52. Consequently, it is possible to reduce the occurrence of a failure in which the first surface 51 and the second surface 52 of the mirror 5 are erroneously mounted on the mirror 5 and in which thus the semiconductor laser module 10 become defective.

Moreover, the notch portion 52x is provided in the second surface 52 which is not used in the reflection of the laser light R1, and thus the reflection performance of the laser light R1 by the first surface 51 is not affected.

The present invention is not limited to the embodiment described above, and can be various variations and modifications. As long as the object of the present invention can be achieved, variations and modifications are also included in the present invention. For example, although the present embodiment provides three constituent elements of the semiconductor laser element 3, the lens 4 and the mirror 5, there is no limitation to the embodiment, and one or a plurality of constituent elements other than three may be provided.

The configurations of the mirrors in the embodiments and variations 1 to 4 described above may be combined as necessary.

EXPLANATION OF REFERENCE NUMERALS 1 laser oscillator
3, 31, 32, 33 semiconductor laser element
5, 5a, 5b, 5c mirror
5P, 5Q, 5R, 5S mirror
10 semiconductor laser module
20 optical fiber
51 first surface
52 second surface
52x notch portion
L width
R1 laser light
R2 return light
t distance

What is claimed is:
1. A semiconductor laser module comprising:
a semiconductor laser element that emits laser light, and
a mirror that includes a first surface which reflects laser light and which transmits visible light and a second surface which transmits the laser light and which reflects the visible light;
wherein the laser light is applied to the first surface of the mirror,
the laser light has a wavelength of from 900 nm to 1000 nm, and
the first surface and the second surface further transmit light whose wavelength is longer than a wavelength of the laser light applied by the semiconductor laser element.
2. The semiconductor laser module according to claim 1, wherein surface roughness of the second surface is higher than surface roughness of the first surface.
3. The semiconductor laser module according to claim 1, wherein the second surface is a spherical surface or a cylindrical surface.
4. The semiconductor laser module according to claim 1, wherein a distance between the first surface and the second surface is longer than a half of a width of the first surface.
5. The semiconductor laser module according to claim 1, wherein the second surface includes a notch portion.
6. A laser oscillator comprising the semiconductor laser module according to claim 1.

* * * * *